United States Patent
Hashi

(10) Patent No.: US 10,340,930 B2
(45) Date of Patent: Jul. 2, 2019

(54) QUANTUM INTERFERENCE DEVICE, AN ATOMIC OSCILLATOR, AN ELECTRONIC APPARATUS, AND A VEHICLE

(71) Applicant: Seiko Epson Corporation, Tokyo (JP)

(72) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 174 days.

(21) Appl. No.: 15/642,817

(22) Filed: Jul. 6, 2017

(65) Prior Publication Data

US 2018/0013440 A1 Jan. 11, 2018

(30) Foreign Application Priority Data

Jul. 8, 2016 (JP) ................ 2016-136128

(51) Int. Cl.
*G04F 5/14* (2006.01)
*H03L 7/26* (2006.01)
*H03B 17/00* (2006.01)

(52) U.S. Cl.
CPC ............. *H03L 7/26* (2013.01); *G04F 5/14* (2013.01); *H03B 17/00* (2013.01); *H03B 2200/0044* (2013.01)

(58) Field of Classification Search
CPC ............. H03L 7/26; H03B 17/00; G04F 5/14
See application file for complete search history.

(56) References Cited

U.S. PATENT DOCUMENTS

2014/0232478 A1 8/2014 Maki
2015/0102863 A1* 4/2015 Hashi ................. H03L 7/26
331/94.1

FOREIGN PATENT DOCUMENTS

JP 2014-157987 A 8/2014

* cited by examiner

*Primary Examiner* — Jeffrey M Shin
(74) *Attorney, Agent, or Firm* — Harness, Dickey & Pierce, P.L.C.

(57) ABSTRACT

A quantum interference device includes an atom cell module including an atom cell in which alkali metal is encapsulated, a light source that emits light adapted to excite the alkali metal, and a heater that heats the atom cell and the light source, a package that houses the atom cell module, and a controller adapted to control drive of the heater so that the light source becomes at a set temperature, $R \le (Tv-Tout)/Qv$ is satisfied, where R [° C./W] is a thermal resistance between the atom cell module and the package, Tv [° C.] is the set temperature, Tout [° C.] is an upper limit value of a usage environmental temperature set to a value lower than the set temperature, Qv [W] is an amount of heat generation of the light source.

10 Claims, 7 Drawing Sheets

QUANTUM INTERFERENCE DEVICE, AN ATOMIC OSCILLATOR, AN ELECTRONIC APPARATUS, AND A VEHICLE

CROSS-REFERENCE TO RELATED APPLICATIONS

This application claims priority to Japanese Patent Application No. 2016-136128, filed Jul. 8, 2016, the entirety of which is hereby incorporated by reference.

BACKGROUND

1. Technical Field

The present disclosure relates to a quantum interference device, an atomic oscillator, an electronic apparatus, and a vehicle.

2. Related Art

As an oscillator having long-term accurate oscillation characteristics, there has been known an atomic oscillator, which oscillates based on the energy transition of an atom of alkali metal such as rubidium or cesium. In general, the operation principles of atomic oscillators are roughly classified into a system using a double resonance phenomenon due to light and microwave, and a system using the quantum interference effect (coherent population trapping (CPT)) due to two types of light different in wavelength from each other. Among these systems, in particular, the atomic oscillator of the system using the CPT is easy to achieve miniaturization and reduction in power consumption, and is therefore expected to be installed in a variety of equipment in recent years.

For example, the atomic oscillator according to JP-A-2014-157987 is provided with a unit including a light source, an atom cell, a heater, and so on to cause the quantum interference effect, a package housing the unit, and a support for supporting the unit in the package with respect to the package. In this atomic oscillator, by suppressing the transfer of the heat from the unit to the package via the support, reduction in power consumption is achieved.

However, in the past, if simply adopting the package structure enhancing the heat-insulating property as much as possible as in the atomic oscillator according to JP-A-2014-157987, there is a problem that the frequency stability degrades in the case in which the external environmental temperature becomes high. In the atomic oscillator of the system using the CPT, there is generally used a vertical cavity surface emitting laser (Vcsel) as the light source, and the reason that such a problem occurs is that the temperature of the light source rises due to heating of the light source itself, and accordingly, the wavelength of the light source fluctuates.

SUMMARY

An advantage of some aspects of the disclosure is to provide a quantum interference device and an atomic oscillator capable of exerting a good frequency characteristic, and further provide an electronic apparatus and a vehicle each equipped with such a quantum interference device.

The advantage described above can be achieved by the following application examples of the disclosure.

A quantum interference device according to this application example includes an atom cell module including an atom cell in which alkali metal is encapsulated, a light source adapted to emit light for exciting the alkali metal, and a heater adapted to heat the atom cell and the light source, a package adapted to house the atom cell module, and a controller adapted to control drive of the heater so that the light source becomes at a set temperature, and defining a thermal resistance between the atom cell module and the package as R [° C./W], the set temperature as Tv [° C.], an upper limit value of a usage environmental temperature set to a value lower than the set temperature as Tout [° C.], and an amount of heat generation of the light source as Qv [W], the following is satisfied.

$$R \le (Tv - Tout)/Qv$$

According to such a quantum interference device, even if the usage environmental temperature (the temperature of the outside of the package) becomes the high temperature close to the set temperature of the light source, the heat due to the heating of the light source is released to the package to reduce the wavelength fluctuation due to the rise in temperature of the light source, and as a result, it is possible to exert the good frequency characteristic.

In the quantum interference device according to the application example, it is preferable that the atom cell module further includes a support disposed between the atom cell and the package, and an interconnection substrate having flexibility and including an interconnection adapted to electrically connect the light source and the package to each other, and a thermal resistance of the support is lower than a thermal resistance of the interconnection substrate.

It is easier for the support to be arranged symmetrically about the light source compared to the interconnection substrate. Therefore, by making the thermal resistance of the support lower than the thermal resistance of the interconnection substrate, it is possible to evenly release the heat due to the heating of the light source to the package compared to the case in which the thermal resistance of the support is higher than the thermal resistance of the interconnection substrate. As a result, the deterioration in characteristic of the quantum interference device can appropriately be reduced.

In the quantum interference device according to the application example, it is preferable that defining a thermal resistance due to solid heat conduction between the atom cell module and the package as R1 [° C./W], and a thermal resistance due to radiation between the atom cell module and the package as R2 [° C/W], R1/R2 is not lower than 0.5 and not higher than 2.0.

According to this configuration, it is possible to achieve homogenization of the temperature distribution in the atom cell module.

In the quantum interference device according to the application example, it is preferable that the R1 is smaller than the R2.

According to this configuration, it is possible to easily and appropriately release the heat by the heating of the light source to the package.

In the quantum interference device according to the application example, it is preferable that the R1 is larger than the R2.

According to this configuration, by lowering the temperature of a part of the atom cell, it is possible to intentionally keep the alkali metal in the liquid state or the solid state in that part, for example.

In the quantum interference device according to the application example, it is preferable that the atom cell module further includes a first interconnection substrate having flexibility and including a first interconnection adapted to electrically connect the light source and the package to each other, a photodetector adapted to detect the light, and a second interconnection substrate having flexibility and including a second interconnection adapted to electrically connect the photodetector and the package to each other, and a thermal resistance of the first interconnection is lower than a thermal resistance of the second interconnection.

According to this configuration, it is possible to easily and appropriately release the heat by the heating of the light source to the package.

In the quantum interference device according to the application example, it is preferable that the R is not smaller than 3000 [° C./W].

According to this configuration, it is possible to make the power consumption extremely low (e.g., equal to or lower than 100 mW).

In the quantum interference device according to the application example, it is preferable that a pressure in the package is not higher than 1 Pa.

According to this configuration, it is possible to substantively eliminate the heat conduction due to the convection between the atom cell module and the package to effectively reduce the power consumption, and at the same time neglect the thermal resistance due to the convection between the atom cell module and the package in the calculation of the relational expression.

An atomic oscillator according to an application example includes an atom cell module including an atom cell in which alkali metal is encapsulated, a light source adapted to emit light for exciting the alkali metal, and a heater adapted to heat the atom cell and the light source, a package adapted to house the atom cell module, and a controller adapted to control drive of the heater so that the light source becomes at a set temperature, and defining a thermal resistance between the atom cell module and the package as R [° C./W], the set temperature as Tv [° C.], an upper limit value of a usage environmental temperature set to a value lower than the set temperature as Tout [° C.], and an amount of heat generation of the light source as Qv [W], the following is satisfied.

$$R \leq (Tv - Tout)/Qv$$

According to such an atomic oscillator, even if the usage environmental temperature (the temperature of the outside of the package) becomes the high temperature close to the set temperature of the light source, the heat due to the heating of the light source is released to the package to reduce the wavelength fluctuation due to the rise in temperature of the light source, and as a result, it is possible to exert the good frequency characteristic.

An electronic apparatus according to an application example includes the quantum interference device according to any one of the application examples described above.

According to such an electronic apparatus, since the quantum interference device having the good frequency characteristic is provided, it is possible to exert excellent reliability.

A vehicle according to an application example includes the quantum interference device according to any one of the application examples described above.

According to such a vehicle, since the quantum interference device having the good frequency characteristic is provided, it is possible to exert excellent reliability.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a vehicle according to the disclosure will be described in detail based on some preferred embodiments shown in the accompanying drawings.

1. Atomic Oscillator (Quantum Interference Device)

Firstly, an atomic oscillator as a kind of quantum interference device according to the disclosure will be described. It should be noted that although an example of applying the quantum interference device according to the disclosure to the atomic oscillator will hereinafter be described, the quantum interference device according to the disclosure can be applied not only to the atomic oscillator, but also to, for example, a magnetic sensor and a quantum memory.

FIRST EMBODIMENT

Figure 1:
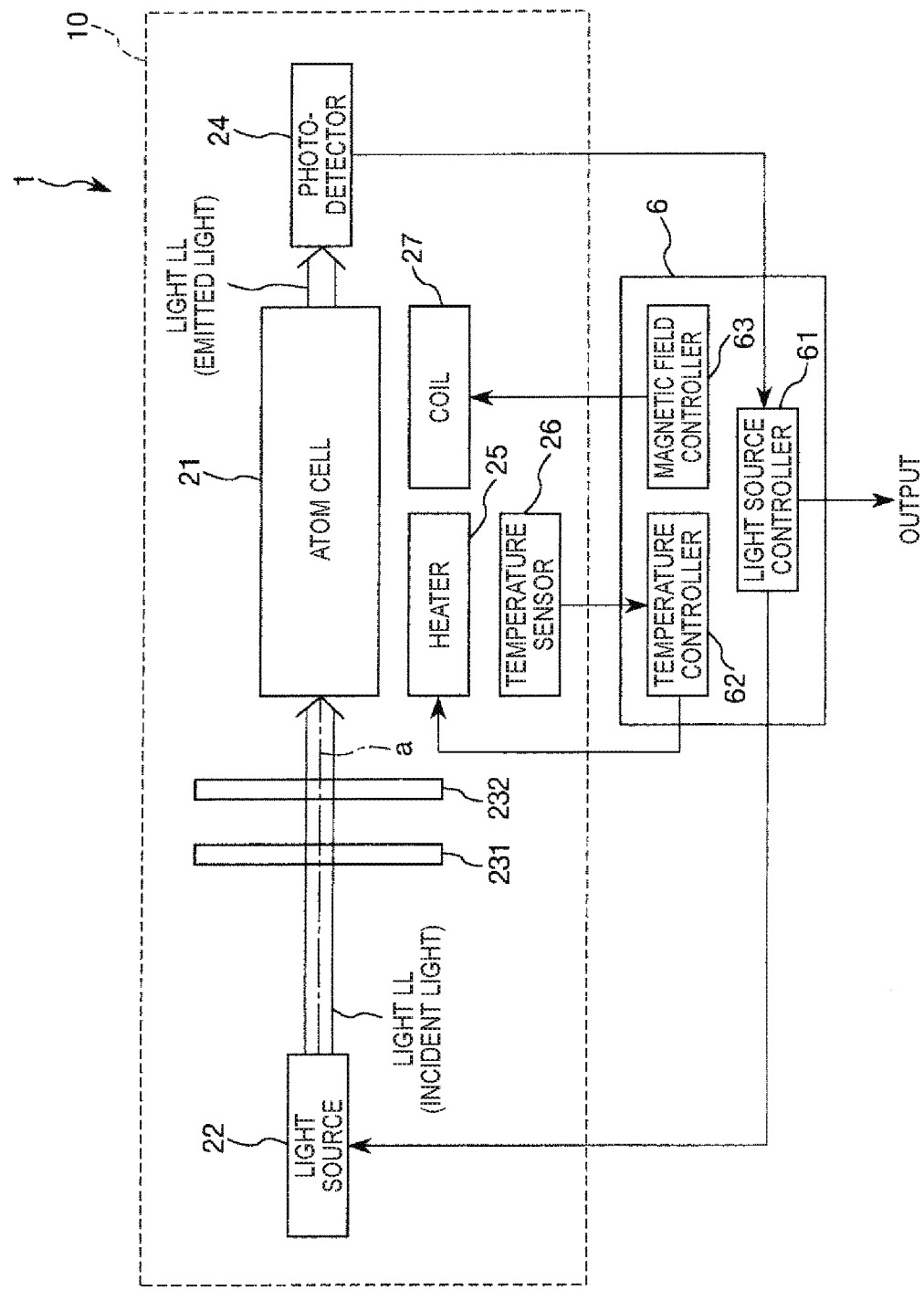
FIG. 1 is a schematic diagram showing an atomic oscillator (a quantum interference device) according to a first embodiment of the disclosure.

FIG. 1 is a schematic diagram showing the atomic oscillator (quantum interference device) according to the first embodiment.

The atomic oscillator 1 shown in FIG. 1 is an atomic oscillator using the quantum interference effect (coherent population trapping (CPT)) with which there occurs a phenomenon that when irradiating an alkali metal atom with two resonance light beams having specific wavelengths different from each other at the same time, the two resonance light beams are transmitted through the alkali metal without being absorbed by the alkali metal. It should be noted that the phenomenon due to the quantum interference effect is also referred to as electromagnetically induced transparence (EIT) phenomenon.

As shown in FIG. 1, the atomic oscillator 1 has a package part 10 for causing the quantum interference effect, and a controller 6 for controlling the package part 10. Here, the package part 10 includes an atom cell 21, a light source 22, optical components 231, 232 (an optical system 23), a photodetector 24, a heater 25, a temperature sensor 26, and a coil 27. Further, the controller 6 has a light source controller 61, a temperature controller 62, and a magnetic field controller 63. Firstly, an outline of the atomic oscillator 1 will hereinafter be described.

In the atomic oscillator 1, the light source 22 irradiates the atom cell 21 with the light LL along an optical axis a via the optical components 231, 232 and the photodetector 24 detects the light LL having been transmitted through the atom cell 21.

The atom cell 21 has a light transmissive property, and alkali metal (metal atom) is encapsulated in the atom cell 21. The alkali metal has energy levels of three-level system comprising two ground levels different from each other, and an excited level. Further, the alkali metal in the atom cell 21 is heated by the heater 25, and becomes in a gas state. Further, a magnetic field in a desired direction is applied from the coil 27 to the alkali metal in the atom cell 21, and thus, the alkali metal in the atom cell 21 is in the Zeeman split state.

The light LL emitted from the light source 22 includes two types of light different in frequency from each other. These two types of light cause the EIT phenomenon when the two types of light become a resonance light pair having the frequency difference coinciding with the frequency corresponding to the difference in energy between the two ground levels of the alkali metal in the atom cell 21.

The light source controller 61 controls the frequencies of the two types of light included in the light LL emitted from the light source 22 described above so as to cause the EIT phenomenon based on the detection result of the photodetector 24. Further, the light source controller 61 is provided with a voltage-controlled crystal oscillator (not shown), the oscillation frequency of which is controlled in accordance with the detection result of the photodetector 24. Further, the output signal of the voltage-controlled crystal oscillator (VCXO) is output as a clock signal of the atomic oscillator 1.

Further, the temperature controller 62 controls drive of the heater 25 based on the detection result of the temperature sensor 26 so that the light source 22 becomes at the set temperature. Accordingly, the inside of the atom cell is also controlled at the predetermined temperature. Further, the magnetic field controller 63 controls energization to the coil 27 so that the magnetic field generated by the coil 27 becomes constant.

Such a controller 6 is preferably disposed outside the package part 10 so that each of the light source controller 61, the temperature controller 62 and the magnetic field controller 63 avoids an influence of the heat to ensure more normal operation, and is provided to, for example, an IC chip mounted on a substrate on which the package part 10 is mounted although not shown in the drawings. It should be noted that it is also possible for the controller 6 to be provided to the package part 10.

The schematic configuration of the atomic oscillator is hereinabove described. The package part 10 will hereinafter be described in detail.

Figure 2:
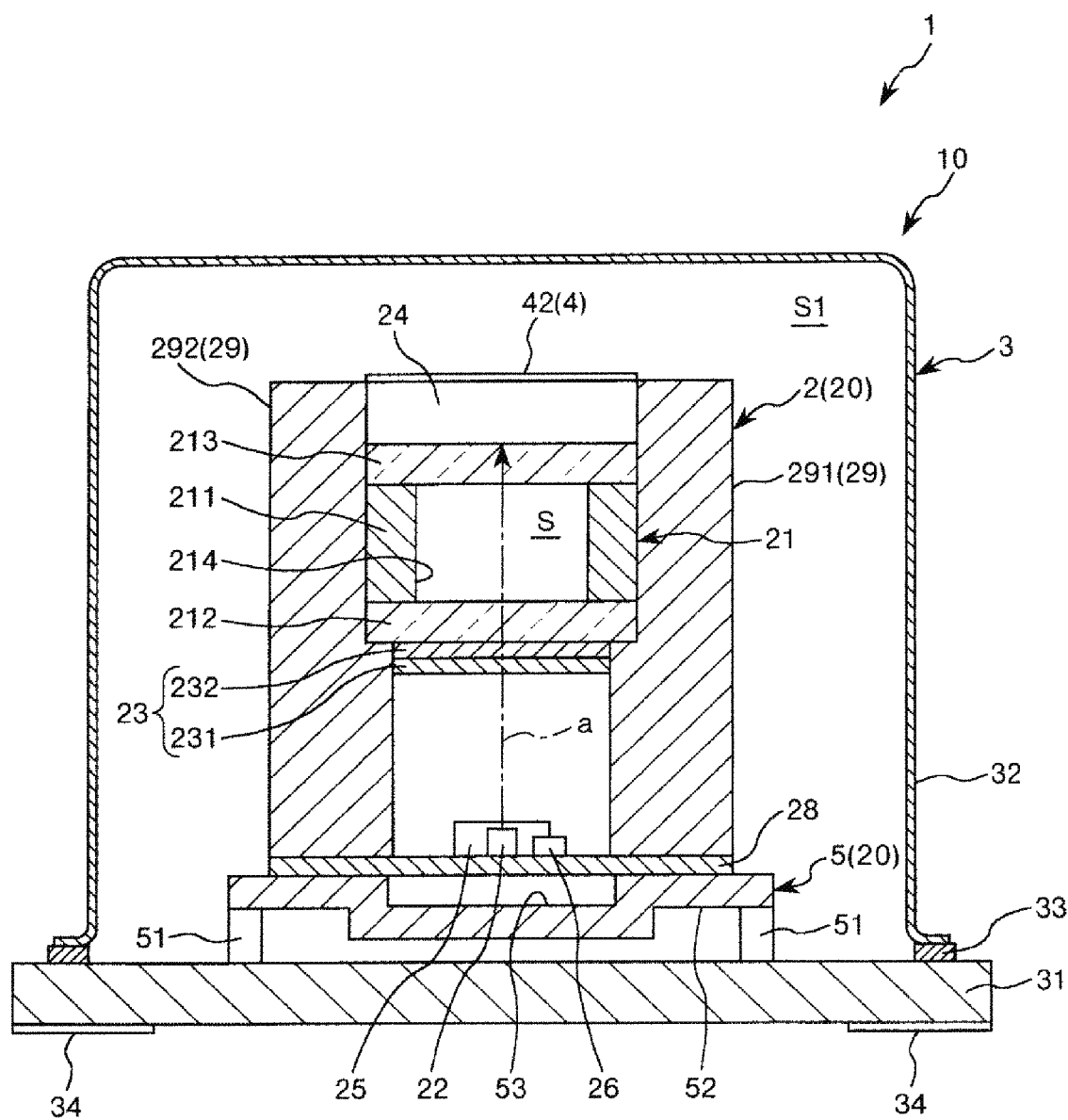
FIG. 2 is a cross-sectional view showing a package part provided to the atomic oscillator shown in FIG. 1.
Figure 3:
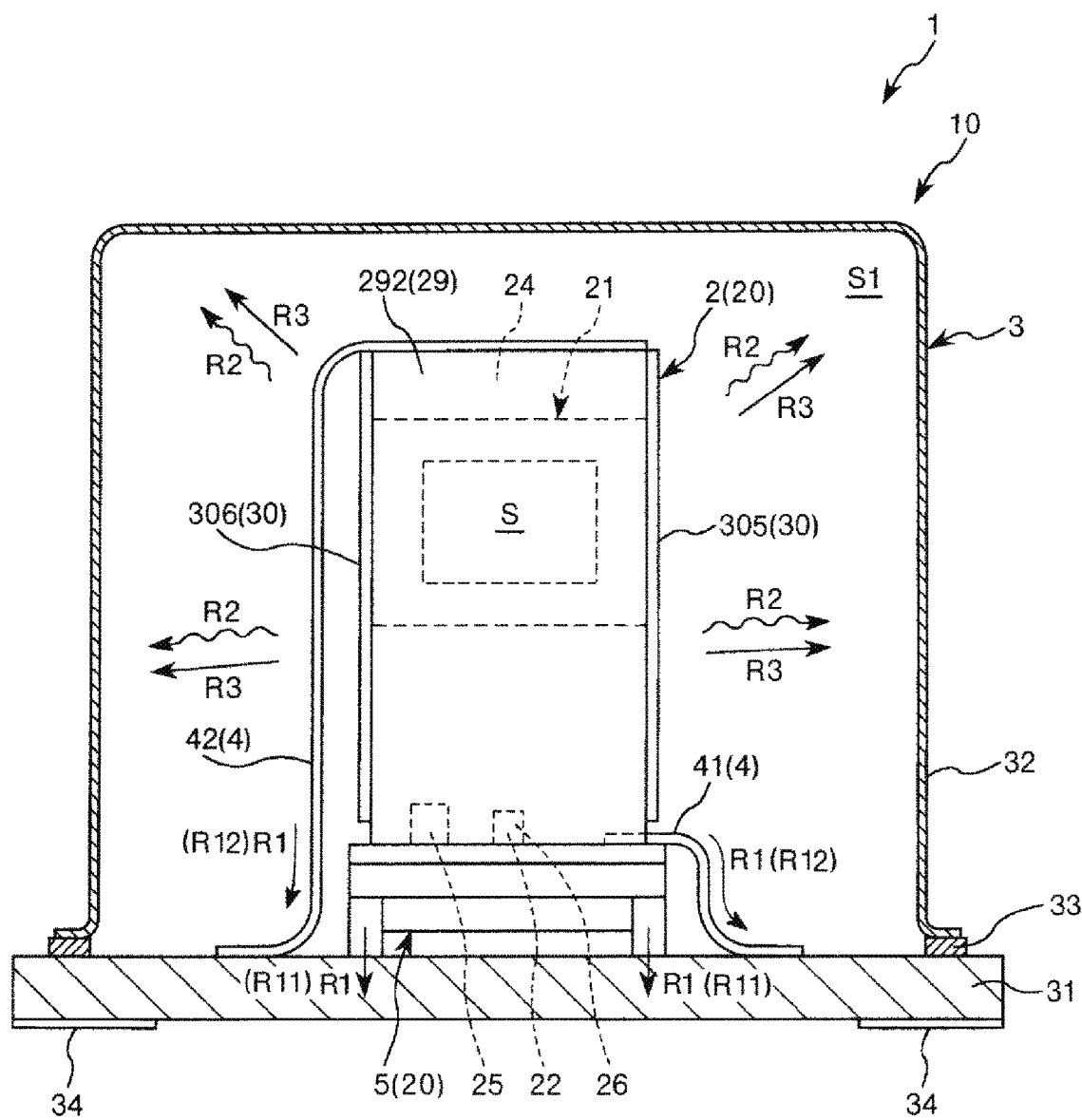
FIG. 3 is a diagram showing a configuration of an atom cell module shown in FIG. 2.
Figure 4:
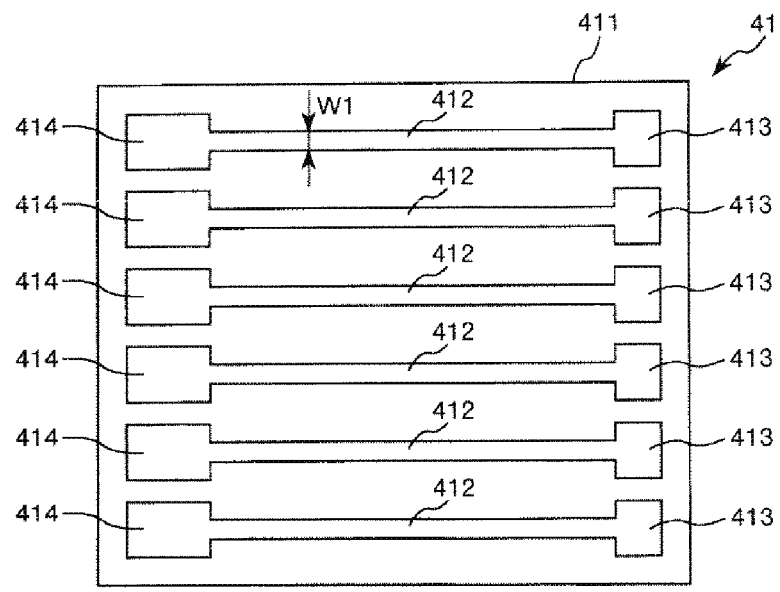
FIG. 4 is a diagram showing the state of spreading a first interconnection substrate shown in FIG. 3 into a plane.
Figure 5:
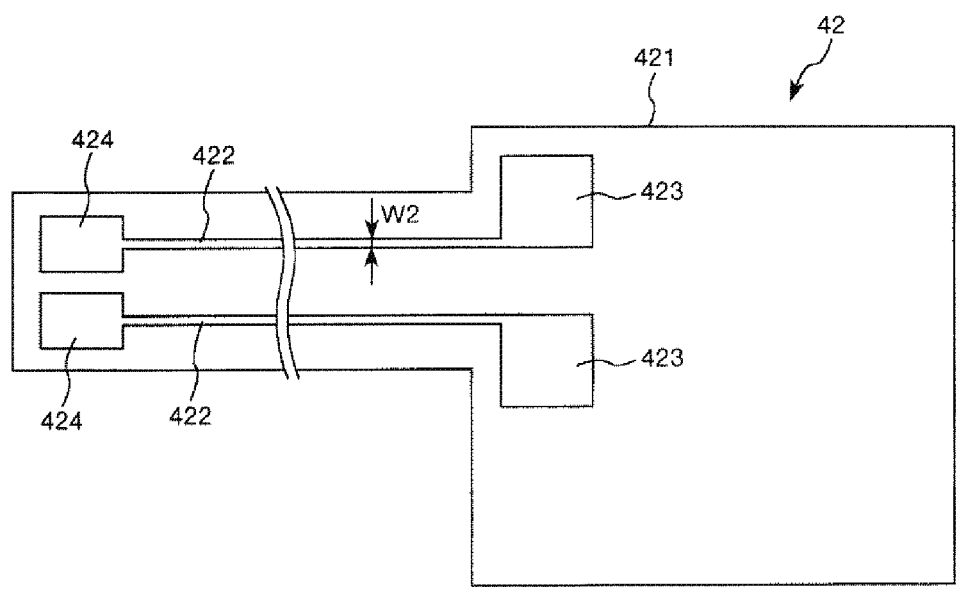
FIG. 5 is a diagram showing the state of spreading a second interconnection substrate shown in FIG. 3 into a plane.

FIG. 2 is a cross-sectional view showing the package part provided to the atomic oscillator shown in FIG. 1. FIG. 3 is a diagram showing a configuration of an atom cell module shown in FIG. 2. FIG. 4 is a diagram showing the state of spreading a first interconnection substrate shown in FIG. 3 into a plane. FIG. 5 is a diagram showing the state of spreading a second interconnection substrate shown in FIG. 3 into a plane. It should be noted that the upper side of FIG. 2 and FIG. 3 is referred to as an "upper side," and the lower side thereof is referred to as a "lower side" in the following descriptions for the sake of convenience of explanation.

As shown in FIG. 2 and FIG. 3, the package part 10 provided to the atomic oscillator 1 is provided with an atom cell module 20, and a package 3 housing the atom cell module 20. Here, the atom cell module 20 is provided with an atom cell unit 2, a support 5 for supporting the atom cell unit 2 to the package 3, and an interconnection part 4 for achieving electrical connection between the atom cell unit 2 and the package 3. It should be noted that it is also possible for a magnetic shield to be disposed on the outer side of the package 3 as needed. Further, in FIG. 2 and FIG. 3, illustration of the coil 27 is omitted for the sake of convenience of explanation. Hereinafter, each of the parts of the package part 10 will sequentially be described.

Atom Cell Unit

The atom cell unit 2 includes the atom cell 21, the light source 22, the optical system 23, the photodetector 24, the heater 25, the temperature sensor 26, a substrate 28, connection members 29, and a cover member 30, and these constituents are unitized. Specifically, on the upper surface (one surface) of the substrate 28, there are mounted the light source 22, the heater 25, the temperature sensor 26 and the connection members 29, and the atom cell 21, the optical system 23 and the photodetector 24 are held by the connection members 29. Further, the cover member 30 is fixed to the outer surface of the connection members 29.

Atom Cell

As shown in FIG. 2 and FIG. 3, the atom cell 21 has a body part 211 provided with a through hole 214 having a cylindrical shape, and a pair of light transmissive parts 212, 213 for blocking the both sides of the through hole 214. Thus, there is formed an internal space S in which the gaseous alkali metal such as rubidium, cesium, or sodium is encapsulated. It should be noted that, in the internal space S, a noble gas such as argon or neon, or an inert gas such as nitrogen can also be encapsulated as a buffer gas together with the alkali metal gas as needed. It should be noted that the shape of the lateral cross-section (the cross-sectional surface in a direction perpendicular to the optical axis a) of the through hole 214, namely the shape of the lateral cross-sectional surface of the internal space S, is not particularly limited, but there can be cited, for example, a circular shape, an elliptical shape, and a polygonal shape such as a rectangular shape.

Each of the light transmissive parts 212, 213 of the atomic cell 21 has permeability with respect to the light LL from the light source 22. One light transmissive part 212 is an "incident side light transmissive part" through which the light LL entering the atom cell 21 is transmitted, and the other light transmissive part 213 is an "exit side light transmissive part" through which the light LL emitted from the atom cell 21 is transmitted.

The constituent material of the light transmissive parts 212, 213 is not particularly limited providing the permeability with respect to the light LL described above is provided, but there can be cited, for example, a glass material and a quartz crystal. Further, the constituent material of the body part 211 is not particularly limited, but can also be a silicon material, a ceramic material, a metal material, a resin material, or the like, and can also be the glass material, the quartz crystal, or the like similarly to the light transmissive parts 212, 213.

Further, each of the light transmissive parts 212, 213 is airtightly bonded to the body part 211. Thus, the internal space S of the atom cell 21 can be made to be an airtight space. The bonding method of the body part 211 and the light transmissive parts 212, 213 in the atom cell 21 is determined in accordance with the constituent materials of these parts, and is not particularly limited, but there can be used, for example, a bonding method with an adhesive, a direct bonding method, and an anodic bonding method.

In the periphery of such an atom cell 21 as described hereinabove, there is disposed the coil 27 shown in FIG. 1 although not illustrated in FIG. 2 and FIG. 3. More specifically, the coil 27 is formed of, for example, a coil disposed to be wound around the outer circumference of the atom cell 21 so as to form a solenoid configuration, or a pair of coils disposed to be opposed to each other via the atom cell 21 so as to form a Helmholtz configuration. The coil 27 has a function of applying a magnetic field to the alkali metal located in the atom cell 21. Thus, it is possible to enlarge the degenerate gaps between the energy levels different from each other of the alkali metal atom located in the atom cell 21 using the Zeeman split to thereby improve the resolution. As a result, the accuracy of the oscillation frequency of the atomic oscillator 1 can be improved.

It should be noted that the magnetic field generated by the coil 27 can be either one of a direct-current magnetic field and an alternating-current magnetic field, or can also be a magnetic field obtained by superimposing the direct-current magnetic field and the alternating-current magnetic field on each other. Further, the coil 27 can be disposed in the package 3, or can also be disposed outside the package.

Light Source

The light source 22 has a function of emitting the light LL for exciting the alkali metal atoms in the atom cell 21. The light source 22 is not particularly limited providing the light source 22 can emit the light LL including such resonance light pair as described above, and it is preferable to use a light emitting element such as a semiconductor laser such as a vertical cavity surface emitting laser (VCSEL).

Optical System

The optical system 23 includes the optical components 231, 232 disposed on the light path of the light LL between the light source 22 and the atom cell 21 described above. In the present embodiment, the optical component 231 and the optical component 232 are arranged in this order from the light source 22 side to the atom cell 21 side.

The optical component 231 is a neutral density filter (ND filter). Thus, it is possible to adjust (decrease) the intensity of the light LL entering the atom cell 21. Therefore, even in the case in which the output of the light source 22 is high, it is possible to set the intensity of the light LL entering the atom cell 21 to a desired level.

The optical component 232 is a ¼ wave plate. Thus, it is possible to convert the light LL from the light source 22 from linearly polarized light into circularly polarized light (right circularly polarized light or left circularly polarized light). By using the light LL circularly polarized, it is possible to increase the number of atoms developing the desired EIT phenomenon to increase the intensity of the desired EIT signal. As a result, the oscillation characteristics of the atomic oscillator 1 can be improved.

Further, in the present embodiment, it is also possible to dispose other optical components such as a lens or polarization plate besides the wave plate and neutral density filter between the light source 22 and the atom cell 21. Further, depending on the intensity of the excitation light from the light source 22, the optical component 231 can be omitted. Further, the arrangement order of the optical components 231, 232 is not limited to the order described above, but is arbitrary.

Photodetector

The photodetector 24 has a function of detecting the intensity of the light LL having been transmitted through the atom cell 21. The photodetector 24 is not particularly limited providing such light LL as described above can be detected, and a photodetector (a light receiving element) such as a solar cell or a photodiode can be used as the photodetector 24.

Heater

The heater 25 has a heating resistive element (a heating part) for generating heat due to energization. The heater 25 is disposed on the substrate 28. Further, the heat from the heater 25 is transmitted to the atom cell 21 via the substrate 28 and the connection members 29. Thus, the atom cell 21 (more specifically, the alkali metal in the atom cell 21) is heated, and the alkali metal in the atom cell 21 can be kept in a gaseous state with the desired concentration. Further, the heat from the heater 25 is also transferred to the light source 22 via the substrate 28. Thus, the temperature control of the light source 22 can be performed with high accuracy.

Further, the heater 25 is separated from the atom cell 21. Thus, an unwanted magnetic field generated by the energization of the heater 25 can be prevented from having a harmful influence on the metal atom in the atom cell 21.

It should be noted that the installation position of the heater 25 is not limited to the position described above but is arbitrary providing the atom cell 21 and the light source 22 can be heated. Further, the heater 25 can also be formed of a plurality of heating resistive element different in installation position from each other.

Temperature Sensor

The temperature sensor 26 is for detecting the temperature of the light source 22, the heater 25 or the atom cell 21. The temperature sensor 26 is not particularly limited, and a variety of known temperature sensors such as a thermistor or a thermocouple can be used as the temperature sensor 26. Further, an amount of the heat generated by the heater 25 described above is controlled based on the detection result of the temperature sensor 26. Thus, it is possible to keep the alkali metal atoms in the atom cell 21 at a desired temperature. The temperature sensor 26 is disposed on the substrate 28. Therefore, it results that the temperature sensor 26 detects the temperature of the light source 22 or the heater 25 via the substrate 28. Alternatively, it results that the temperature sensor 26 detects the temperature of the atom cell 21 via the substrate 28 and the connection members 29. It should be noted that the installation position of the temperature sensor 26 is not limited to the above, and can also be, for example, a place on the connection members 29, a place on the heater 25, or a place on an outside surface of the atom cell 21.

Connection Members

As shown in FIG. 2, the connection members 29 are formed of a pair of connection members 291, 292 disposed so as to sandwich the atom cell 21. The connection members 291, 292 are each formed so as to avoid a passing area of the light LL. Further, the connection members 291, 292 have contact with each of the light transmissive parts 212, 213, or are bonded to each of the light transmissive parts 212, 213 via an adhesive superior in thermal conductivity. It should be noted that the shapes of the connection members 291, 292 are not limited to what are shown in the drawings providing the relative positional relationship between at least the atom cell 21, the light source 22, and the photodetector 24 can be fixed. Further, the connection members 291, 292 can be integrated with each other, or each of the connection members 291, 292 each can be constituted by a plurality of members.

As described above, each of the connection members 29 thermally connects the heater 25 and each of the light transmissive parts 212, 213 to each other. Thus, it is possible to transfer the heat from the heater 25 to each of the light transmissive parts 212, 213 due to the heat conduction by the connection members 291, 292 to thereby heat each of the light transmissive parts 212, 213. Further, it is possible to separate the heater 25 and the atom cell 21 from each other. Therefore, an unwanted magnetic field generated by the energization of the heater 25 can be prevented from having a harmful influence on the alkali metal atom in the atom cell 21. Further, since the number of heaters 25 can be decreased, it is possible to, for example, decrease the number of interconnections for energization to the heaters 25, and as a result, miniaturization of the atomic oscillator 1 can be achieved. It should be noted that here, the expression "thermally connect" means the state in which two members can achieve the solid heat conduction with a loss not higher than 5% therebetween, and includes not only the case in which the two members have contact with each other, but also the case in which another member intervenes between the two members.

As a constituent material of such connection members 29 as described above, it is preferable to use a material superior in thermal conductivity such as a metal material. Further, in order not to hinder the magnetic field from the coil 27, it is preferable to use a nonmagnetic material as the constituent material of the connection members 29.

Cover Members

The cover members 30 are formed of a pair of cover members 305, 306 each having a plate-like shape or a sheet-like shape. The cover members 305, 306 are disposed to as to cover the lateral side of the atom cell 21, the light source 22, and so on exposed from the pair of connection members 291, 292 described above, and are bonded to the connection members 291, 292 with an adhesive or the like.

The cover members 305, 306 each have the reflectance of not lower than 50% with respect to the electromagnetic wave (i.e., a far infrared ray) with the wavelength of 4 μm. Thus, it is possible to suppress the transfer of the heat by the radiation between the atom cell 21 or the light source 22 and the package 3. As the constituent material of such cover members 305, 306, there can be cited, for example, a nonmagnetic metal material.

Substrate

As shown in FIG. 2 and FIG. 3, the substrate 28 has a function of supporting the light source 22, the heater 25, the temperature sensor 26, the connection members 29, and so on described above.

Further, the substrate 28 thermally connects the heater 25 and the connection member 29 to each other, and has a function of transferring the heat from the heater 25 to the connection members 29. Thus, even if the heater 25 is separated from the connection members 29, it is possible to transfer the heat from the heater 25 to the connection members 29. Further, since the light source 22 is mounted on the substrate 28, it is possible to transfer the heat from the heater 25 to the light source 22 via the substrate 28 to thereby perform the temperature control of the light source 22 with accuracy.

Further, the substrate 28 includes interconnections (not shown) to be electrically connected to the light source 22, the heater 25, and the temperature sensor 26. The interconnections are electrically connected to the internal terminals (not shown) disposed on the upper surface of the base 31.

The constituent material of such a substrate 28 is not particularly limited, but there can be cited, for example, a ceramic material and a metal material, and it is possible to use either one of these materials alone, or two or more of these materials in combination. It should be noted that in the case of forming the substrate 28 of a metal material, it is also possible to provide an insulating layer formed of, for example, a resin material, a metal oxide, or a metal nitride on the surface of the substrate 28 as needed for the purpose of preventing short circuit between the interconnections provided to the substrate 28.

Further, similarly to the package 3 described later, in order not to hinder the magnetic field from the coil 27, it is preferable to use a nonmagnetic material as the constituent material of the substrate 28.

It should be noted that the substrate 28 can be omitted depending on the shapes of the connection members 29, the installation position of the heater 25, and so on. In this case, it is sufficient to dispose the heater 25 at a position to have contact with the connection members 29.

Package

As shown in FIG. 2 and FIG. 3, the package 3 has a function of housing the atom cell module 20 (i.e., a structure including the atom cell unit 2, the interconnection part 4 and the support 5). It should be noted that other components than the components described above can also be housed in the package 3.

The package 3 is provided with a base 31 (a base part) having a plate-like shape and a lid member 32 (a lid part) having a bottomed cylindrical shape, and the opening of the lid member 32 is covered by the base 31. Thus, there is formed an internal space S1 for housing the atom cell module 20. Here, the lid member 32 is separated from the atom cell module 20. Thus, it is possible to reduce the thermal interference between the atom cell unit 2 and the package 3.

The base 31 supports the atom cell unit 2 via the support 5. Further, the base 31 forms a rigid interconnection substrate, and on the lower surface of the base 31, there is disposed a plurality of terminals 34. The plurality of terminals 34 is electrically connected to a plurality of internal terminals (not shown) disposed on the upper surface of the base 31 via interconnections not shown.

The constituent material of the base 31 is not particularly limited, but there can be used, for example, a resin material or a ceramics material, and it is preferable to use the ceramics material. Thus, it is possible to make the airtightness of the internal space S1 excellent while realizing the base 31 constituting the rigid interconnection substrate.

The lid member 32 is bonded to such a base 31 as described above. The bonding method of the base 31 and the lid member 32 is not particularly limited, but there can be used, for example, brazing, seam welding, and energy beam welding (e.g., laser welding and electron beam welding). In the present embodiment, the lid member 32 is bonded to the base 31 via a bonding member 33 such as a seam ring, low melting-point glass or an adhesive.

Further, the base 31 and the lid member 32 are airtightly connected to each other. Specifically, the internal space S1 is an airtight space, and is reduced in pressure to a level lower than the atmospheric pressure. In particular, in the present embodiment, the internal space S1 is in a vacuum state (not higher than 1 Pa). Thus, it is possible to reduce the chance that the temperature of the atom cell unit 2, in particular the light source 22, changes in temperature due to convection in the internal space S1. Further, it is possible to reduce the power consumption of the heater 25.

The constituent material of such a lid member 32 is not particularly limited, and, for example, a resin material, a ceramic material and a metal material can be used.

It should be noted that it is also possible to arbitrarily provide a metal film on the inner wall surface of such a package 3 as described hereinabove in order to reduce the radiation between the atom cell module 20 and the package 3. As the constituent material of such a metal film, there can be cited metals such as copper (heat reflectance of 97.93%), silver (heat reflectance of 98.47%), gold (heat reflectance of 98.62%), titanium (heat reflectance of 78.04%), chromium (heat reflectance of 93.77%), iron (heat reflectance of 87.09%), cobalt (heat reflectance of 87.75%), nickel (heat reflectance of 92.38%), aluminum (heat reflectance of 99.03%), iridium (heat reflectance of 98.73%), and lead (heat reflectance of 98.90%), and alloys including at least one of these metals.

Support

The support 5 has a function of supporting the atom cell unit 2 with respect to the base 31 of the package 3. Further, the support 5 has a function of suppressing the heat transfer between the atom cell unit 2 and the package 3. Thus, it is possible to reduce the heat transfer between each part of the atom cell unit 2, in particular the atom cell 21 and the light source 22, and the package 3 to suppress the thermal interference between the atom cell 21 and the light source 22, and the outside of the package 3. Therefore, it is possible to accurately perform the temperature control of the atom cell 21, the light source 22, and so on.

As shown in FIG. 2, the support 5 includes a plurality of leg parts 51 erected on the upper surface side of the base 31, a connector 52 having a plate-like shape connecting upper end parts of the leg parts 51 to each other, and the upper surface of the connector 52 is connected to the substrate 28. On the upper surface of the connector 52 shown in the drawing, there is formed a recess 53 or a through hole (not shown). Thus, the contact area between the connector 52 and the substrate 28 is reduced, and at the same time the thermal resistance of the support 5 is increased.

In the support 5 configured in such a manner, it is possible to elongate the transfer path of the heat from the atom cell unit 2 to the base 31 via the support 5. Therefore, the transfer of the heat between the atom cell unit 2, in particular the atom cell 21 and the light source 22, and the package 3 can further be reduced.

Further, the constituent material of the support 5 is not particularly limited providing the material is relatively low in thermal conductivity, and the support 5 can ensure the rigidity for supporting the atom cell unit 2, but nonmetal such as a resin material or a ceramic material is preferably used, and the resin material is more preferably used. In the case of forming the support 5 mainly using the resin material, it is possible to increase the thermal resistance of the support 5, and even in the case in which the shape of the support 5 is complicated, the support 5 can easily be manufactured using a known method such as injection molding. In particular, in the case of forming the support 5 mainly using the resin material, it is possible to easily form the support 5 formed of a foam high in thermal resistance. Further, as the constituent material of the substrate 5, it is preferable to use a nonmagnetic material in order not to hinder the magnetic field from the coil 27.

As described above, the support 5 is disposed between the atom cell unit 2 and the package 3, and supports the atom cell 21 and the light source 22 in a lump with respect to the base 31. Therefore, it is possible to reduce the heat transfer between the atom cell 21 and the light source 22, and the package 3. Here, the thermal conductivity of the support 5 from the light source 22 side to the package 3 side is preferably not lower than 0.1 W·m$^{-1}$·K$^{-1}$ and not higher than 40.0 W·m$^{-1}$·K$^{-1}$, and further preferably not lower than 0.1 W·m$^{-1}$·K$^{-1}$ and not higher than 0.5 W·m$^{-1}$·K$^{-1}$. Thus, it is possible to suppress the heat conduction between the atom cell 21 and the light source 22, and the package 3 via the support 5 to thereby reduce the chance that the temperature of the atom cell 21 and the light source 22 changes.

Interconnection Part

As shown in FIG. 3, the interconnection part 4 includes an interconnection substrate 41 electrically connecting the substrate 28 and the base 31 to each other, and an interconnection substrate 42 electrically connecting the photodetector 24 and the base 31 to each other.

The interconnection substrates 41, 42 are each formed of a flexible printed circuit board (FPC). In a specific description, as shown in FIG. 4, the interconnection substrate 41 includes a base film 411 and a plurality of interconnections 412 disposed on the base film 411. Similarly, as shown in FIG. 5, the interconnection substrate 42 includes a base film 421 and a plurality of interconnections 422 disposed on the base film 421. It should be noted that although not shown in the drawings, the interconnection substrates 41, 42 are provided with cover films for arbitrarily covering the interconnections 412, 422, respectively. Further, between the layers of the interconnection substrates 41, 42, an adhesive layer can be disposed.

The base films 411, 421 are each an insulating film having a sheet-like shape. The constituent material of the base films 411, 421 is not particularly limited, and a resin material such as polyimide resin can be used.

On such base films 411, 421, there is disposed the plurality of interconnections 412, 422. In one end parts of the interconnections 412, there are disposed terminals 414 to be electrically connected to the base 31, respectively, and in the other end parts of the interconnections 412, there are disposed terminals 413 electrically connected to the substrate 28, respectively. Further, the plurality of interconnections 412 electrically connects the package 3, and the temperature sensor 26, the light source 22, and the heater 25 to each other. Further, in one end parts of the interconnections 422, there are disposed terminals 424 to be electrically connected to the base 31, respectively, and in the other end parts of the interconnections 422, there are disposed terminals 423 electrically connected to the photodetector 24, respectively. Further, the plurality of interconnections 422 electrically connects the package 3 and the photodetector 24 to each other.

In the drawings, each of the interconnections 412, 422 has a shape extending like a straight line. It should be noted that from a viewpoint of increasing the thermal resistance of the interconnections 412, 422, it is also possible for the interconnections 412, 422 to be provided with a part having a meandering shape.

Here, the length of each of the interconnections 422 is longer than the length of each of the interconnections 412. Further, in the present embodiment, the width W1 of each of the interconnections 412 is wider than the width W2 of each of the interconnections 422. According to the configuration described above, the thermal resistance of each of the interconnections 412 is lower than the thermal resistance of each of the interconnections 422. It should be noted that providing a relational expression 1 described later can be satisfied, the widths W1, W2 of the interconnections 412, 422 are not limited to those described above, but can also be equal to each other. Further, the thicknesses of the interconnections 412, 422 can be equal to or different from each other.

The constituent material of such interconnections 412, 422 is not particularly limited, but a metal material is preferably used, and specifically, it is preferable to use, for example, gold, platinum, and copper, and alloys of any of these metals.

Thermal Resistance Between Atom Cell Module and Package

In the package part 10 having the configuration as described above, by setting the internal space S1 in the package 3 in the vacuum state, and using the support 5 having an excellent heat-insulating property, the reduction in power consumption is achieved as described above. On that basis, in the package part 10, by optimizing the thermal resistance (thermal resistance value) between the atom cell module 20 and the package 3, it is possible to exert a good frequency stability even under the relatively high usage environmental temperature. Hereinafter, the thermal resistance between the atom cell module 20 and the package 3 will be described in detail.

As described above, the atomic oscillator 1 as a kind of quantum interference device is provided with the atom cell module 20 including the atom cell 21 having the alkali metal encapsulated therein, the light source 22 for emitting the light LL for exciting the alkali metal, and the heater 25 for heating the atom cell 21 and the light source 22, the package 3 for housing the atom cell module 20, and the temperature controller 62 as a "controller" for controlling the drive of the heater 25 so that the light source 22 becomes at the set temperature.

In such an atomic oscillator 1, the higher the thermal resistance between the atom cell module 20 and the package 3 is made, the more the power consumption of the atomic oscillator 1 can be reduced. However, if such a thermal resistance is simply made excessively high, when the external environmental temperature becomes high, it is unachievable to release the heat due to heating of the light source 22 itself to the outside, the temperature of the light source 22 rises, and accordingly, the wavelength of the light LL from the light source 22 fluctuates. As a result, there occurs a problem that the frequency stability degrades.

Therefore, in the atomic oscillator 1, defining the thermal resistance between the atom cell module 20 and the package 3 as R [° C./W], the set temperature of the light source 22 in the temperature controller 62 as Tv [° C.], an upper limit value of the usage environmental temperature set to a value lower than the set temperature of the light source 22 in the temperature controller 62 as Tout [° C.], and an amount of heat generation of the light source 22 as Qv [W], the following relationship (hereinafter simply referred to as a "relational expression 1") is satisfied.

$$R<(Tv-Tout)/Qv$$

According to such an atomic oscillator 1, even if the usage environmental temperature (the temperature of the outside of the package 3) becomes the high temperature close to the set temperature of the light source 22, the heat due to the heating of the light source 22 is released to the package 3 to reduce the wavelength fluctuation due to the rise in temperature of the light source 22, and as a result, it is possible to exert the good frequency characteristic.

It should be noted that the "upper limit value Tout of the usage environmental temperature" is only required to be a value lower than the set temperature of the light source 22 in the temperature controller 62, but the difference between the "upper limit value Tout of the usage environmental temperature" and the set temperature is preferably not smaller than 5° C. and not larger than 20° C., and is more preferably not smaller than 10° C. and not larger than 15° C. from the viewpoint of achieving both of the good frequency characteristic and the reduction in power consumption. Further, the specific "upper limit value Tout of the usage environmental temperature" is preferably not lower than 40° C. and not higher than 60° C. taking the set temperature of the light source 22 in the temperature controller 62 due to the specification of the light emitting element used for the light source 22 and the requirement of the actual product into consideration. Further, the amount of heat generation Qv is preferably not smaller than 1 mW and not larger than 5 mW from the viewpoint of the reduction in power consumption and the miniaturization of the light source 22.

Here, the thermal resistance R [° C./W] between the atom cell module 20 and the package 3 comprises a thermal resistance R1 [° C./W] due to the solid heat conduction, a thermal resistance R2 [° C./W] due to the radiation, and a thermal resistance R3 [° C./W] due to the convection, and satisfies the following relationship (hereinafter simply referred to as a "relational expression 2").

$$(1/R)=(1/R1)+(1/R2)+(1/R3)$$

That is, the following is obtained.

$$R=(R1\times R2\times R3)/\{(R1\times R2)+(R2\times R3)+(R1\times R3)\}$$

The thermal resistance R1 due to the solid heat conduction between the atom cell module 20 and the package 3 comprises a thermal resistance R11 due to the solid heat conduction in the support 5 and a thermal resistance R12 due to the solid heat conduction in the interconnection part 4. That is, the following is obtained.

$$(1/R1)=(1/R11)+(1/R12)$$

The following is also obtained.

$$R1=R11\times R12/(R1+R2)$$

Further, the thermal resistance R2 due to the radiation between the atom cell module 20 and the package 3 mainly comprises the thermal resistance due to the radiation in the surface of the atom cell unit 2. Further, the thermal resistance R3 due to the convection between the atom cell module 20 and the package 3 mainly comprises the thermal resistance due to the heat conduction via the gas in the package 3.

Here, the pressure in the package 3 is preferably equal to or lower than 1 Pa. Accordingly, it is possible to substantively eliminate the heat conduction due to the convection between the atom cell module 20 and the package 3 (in other words, increase the thermal resistance R3 to an extremely high level compared to the thermal resistances R1, R2) to effectively reduce the power consumption, and at the same time neglect the thermal resistance R3 due to the convection between the atom cell module 20 and the package 3 in the calculation of the relational expression described above.

Further, as described above, the atom cell module 20 includes the support 5 disposed between the atom cell 21 and the package 3, the interconnection substrate 41 (a first interconnection substrate) having flexibility including the interconnections 412 (a first interconnection) for electrically connecting the light source 22 and the package 3, the photodetector 24 for detecting the light LL, and the interconnection substrate 42 (a second interconnection substrate) having flexibility including the interconnections 422 (a second interconnection) for electrically connecting the photodetector 24 and the package 3. Further, the thermal resistance of each of the interconnections 412 is lower than the thermal resistance of each of the interconnections 422.

Accordingly, it is possible to easily and appropriately release the heat by the heating of the light source 22 to the package 3. Further, the thermal resistance of the support 5 is preferably lower than the thermal resistance of the interconnection substrate 41. It is easier for the support 5 to be arranged symmetrically about the light source 22 compared to the interconnection substrate 41. Therefore, by making the thermal resistance of the support 5 lower than the thermal resistance of the interconnection substrate 41, it is possible to evenly release the heat due to the heating of the light source 22 to the package 3 compared to the case in which the thermal resistance of the support 5 is higher than the thermal resistance of the interconnection substrate 41. As a result, the deterioration in characteristic of the atomic oscillator 1 can appropriately be reduced.

Further, defining the thermal resistance due to the solid heat conduction between the atom cell module 20 and the package 3 as R1 [° C./W], and the thermal resistance due to the radiation between the atom cell module 20 and the package 3 as R2 [° C./W], R1/R2 is preferably not lower than 0.5 and not higher than 2.0, and is more preferably not lower than 0.8 and not higher than 1.5. According to this configuration, it is possible to achieve homogenization of the temperature distribution in the atom cell module 20.

Here, in the case in which the thermal resistance R1 is lower than the thermal resistance R2, it is possible to easily and appropriately release the heat due to the heating of the light source 22 to the package 3. In contrast, in the case in which the thermal resistance R1 is higher than the thermal resistance R2, by lowering the temperature of a part of the atom cell 21, it is possible to intentionally keep the alkali metal in the liquid state or the solid state in that part, for example. According to this configuration, it is possible to reduce the characteristic fluctuation due to the alkali metal in the liquid state or the solid state of the atom cell 21.

Further, the thermal resistance R is only required to satisfy the relational expression 1 described above, but is preferably equal to or higher than 3000 [° C./W], and is more preferably equal to or higher than 4000 [° C./W]. According to this configuration, it is possible to make the power consumption extremely low (e.g., equal to or lower than 100 mW). In other words, it is possible to realize the atomic oscillator 1 capable of exerting the good frequency characteristic under the high temperature while achieving the reduction in power consumption.

In order to satisfy such a thermal resistance R, it is preferable for the thermal resistance R1 to be not lower than 4000 [° C./W] and not higher than 9000 [° C./W], and for the thermal resistance R2 to be not lower than 5000 [° C./W] and not higher than 11000 [° C./W]. According to this configuration, it is possible to achieve homogenization of the temperature distribution in the atom cell module 20. Hereinafter, specific examples of satisfying the relational expression 1 described above will be cited as an example.

FIRST SPECIFIC EXAMPLE

For example, assuming the set temperature Tv as 60 [° C.], the upper limit value Tout as 45 [° C.], and an amount of the heat generation Qv of the light source 22 as 3 [mW], the right-hand side of the relational expression 1 described above becomes 5000 [° C./W]. On the other hand, assuming the thermal resistance R1 due to the solid heat conduction as 8200 [° C./W], and the thermal resistance R2 due to the radiation as 10000 [° C./W], the thermal resistance R (the left-hand side of the relational expression 1) is obtained as 4500 [° C./W] according to the relational expression 2 described above, which satisfies the relational expression 1 described above.

SECOND SPECIFIC EXAMPLE

In the case of assuming the upper limit value Tout as 50 [° C.] in the first specific example described above, the right-hand side of the relational expression 1 described above becomes 3333 [° C./W]. On the other hand, assuming the thermal resistance R1 due to the solid heat conduction as 5000 [° C./W], and the thermal resistance R2 due to the radiation as 10000 [° C./W], the thermal resistance R (the left-hand side of the relational expression 1) is obtained as 3333 [° C./W] according to the relational expression 2 described above, which satisfies the relational expression 1 described above.

THIRD SPECIFIC EXAMPLE

In the case of assuming the upper limit value Tout as 50 [° C.] in the first specific example described above, the right-hand side of the relational expression 1 described above becomes 3333 [° C./W]. On the other hand, assuming the thermal resistance R1 due to the solid heat conduction as 8200 [° C./W], and the thermal resistance R2 due to the radiation as 5600 [° C./W], the thermal resistance R (the left-hand side of the relational expression 1) is obtained as 3328 [° C./W] according to the relational expression 2 described above, which satisfies the relational expression 1 described above.

SECOND EMBODIMENT

Then, a second embodiment will be described.

Figure 6:
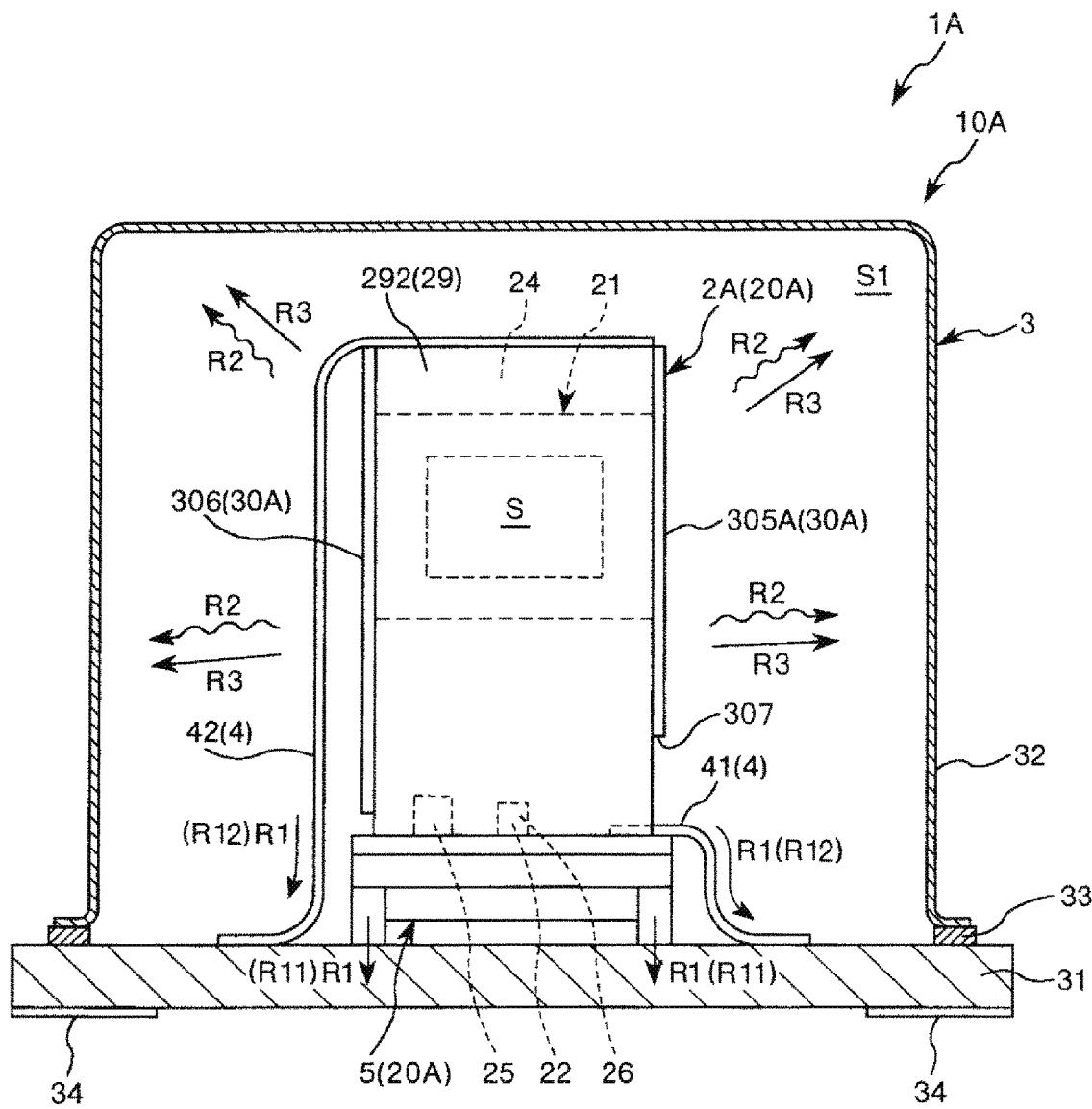
FIG. 6 is a diagram for explaining an atom cell module in an atomic oscillator (a quantum interference device) according to a second embodiment of the disclosure.

FIG. 6 is a diagram for explaining an atom cell module in an atomic oscillator (a quantum interference device) according to the second embodiment.

The atomic oscillator according to the present embodiment is substantially the same as the first embodiment described above except the point that the configuration of the cover member is different.

It should be noted that in the following description, the second embodiment will be described with a focus on the difference from the embodiment described above, and the description of substantially the same issues will be omitted. Further, in FIG. 6, the constituents substantially identical to those of the embodiments described above are denoted by the same reference symbols.

The package part 10A provided to the atomic oscillator 1A shown in FIG. 6 is provided with an atom cell module 20A housed in the package 3. The atom cell module 20A is provided with the atom cell unit 2A including the cover member 30A. The cover members 30A are formed of a pair of cover members 305A, 306 each having a plate-like shape or a sheet-like shape. The cover member 305A on the interconnection substrate 41 side is shorter in length in a vertical direction than the cover member 306 on the interconnection substrate 42 side, and is disposed so as to form an opening 307 through which the light source 22 is exposed between the pair of connection members 291, 292. Thus, it is possible to make the thermal resistance due to the radiation between the light source 22 and the package 3 lower compared to the first embodiment described above. Therefore, it is possible to easily and appropriately release the heat from the light source 22 to the package 3. Further, even in the case of increasing the thermal resistance of the support 5 to an extremely high level, it is possible to set the entire thermal resistance between the atom cell module 20A and the package 3 so as to satisfy the relational expression 1 described above.

According also to the atomic oscillator 1A related to the second embodiment described herein above, the good frequency characteristic can be exerted.

2. Electronic Apparatus

Such an atomic oscillator 1 or 1A equipped with the quantum interference device according to the disclosure as described hereinabove can be incorporated in a variety of electronic apparatuses.

An example of the electronic apparatus equipped with the atomic oscillator provided with the quantum interference device according to the disclosure will hereinafter be described.

Figure 7:
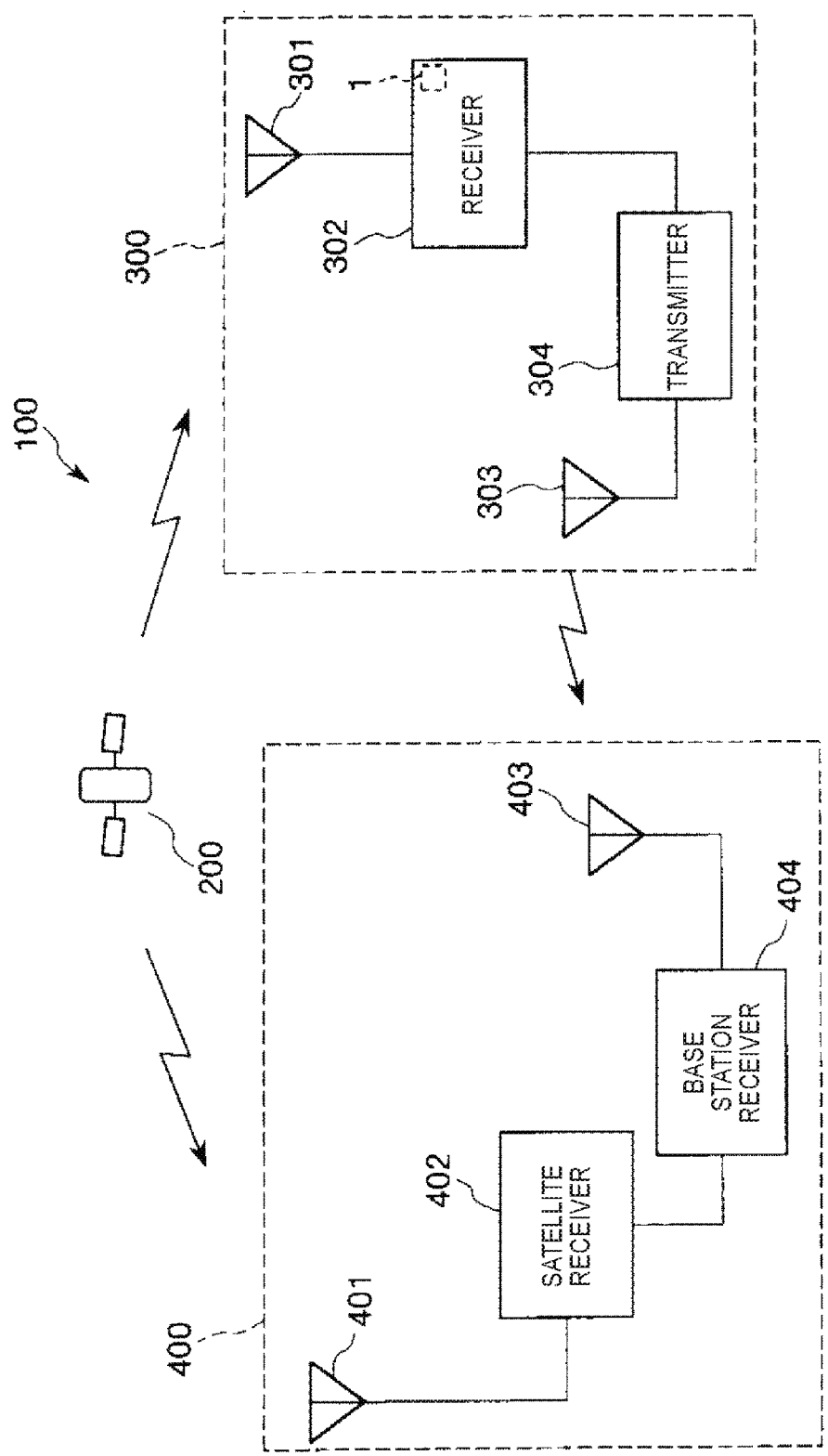
FIG. 7 is a diagram showing a schematic configuration in the case of using the atomic oscillator in a positioning system using a GPS satellite.

FIG. 7 is a diagram showing a schematic configuration in the case of using the atomic oscillator according to the disclosure to a positioning system using a GPS satellite.

The positioning system 100 shown in FIG. 7 is constituted by the GPS satellite 200, a base station device 300, and a GPS receiver 400.

The GPS satellite 200 transmits positioning information (a GPS signal).

The base station device 300 is provided with a receiver 302 for accurately receiving the positioning information from the GPS satellite 200 via an antenna 301 installed at, for example, an electronic reference point (a GPS continuous observation station), and a transmitter 304 for transmitting the positioning information, which has been received by the receiver 302, via an antenna 303.

Here, the receiver 302 is an electronic apparatus equipped with the atomic oscillator 1 (or the atomic oscillator LA) described above as a reference frequency oscillation source for the receiver 302. Such a receiver 302 is equipped with the atomic oscillator 1 (a kind of the quantum interference device) having the good frequency characteristic, and can therefore exert excellent reliability. Further, the positioning information having been received by the receiver 302 is transmitted by the transmitter 304 in real time.

The GPS receiver 400 is provided with a satellite receiver 402 for receiving the positioning information from the GPS satellite 200 via an antenna 401, and a base station receiver 404 for receiving the positioning information from the base station device 300 via an antenna 403.

It should be noted that, the electronic apparatus according to the disclosure is not limited to those described above, and as the electronic apparatus according to the disclosure, there can be cited, for example, a smartphone, a tablet terminal, a timepiece, a cellular phone, a digital still camera, an inkjet ejection device (e.g., an inkjet printer), a personal computer (a mobile personal computer and a laptop personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, digital terrestrial broadcasting equipment, and a cellular phone base station.

3. Vehicle

Such an atomic oscillator 1 or 1A equipped with the quantum interference device according to the disclosure as described above can be incorporated in a variety of vehicles.

Hereinafter, an example of the vehicle according to the disclosure will be described.

Figure 8:
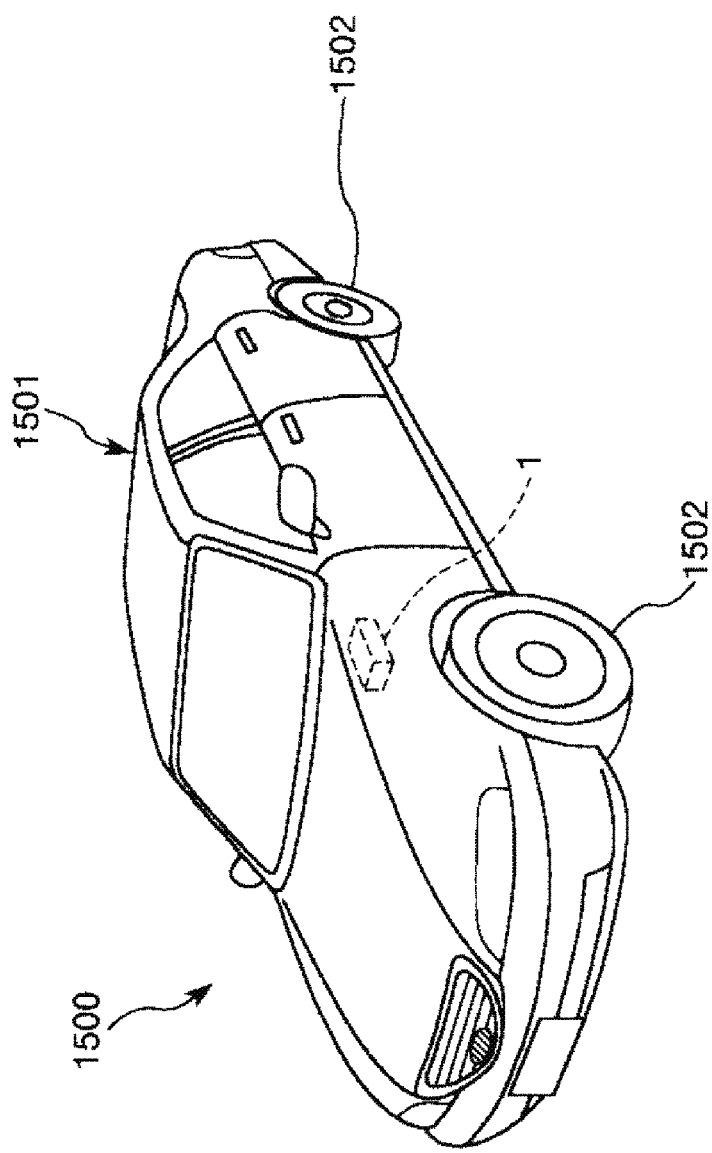
FIG. 8 is a diagram showing an example of a vehicle.

FIG. 8 is a diagram showing an example of the vehicle according to the disclosure.

The vehicle 1500 shown in FIG. 8 has a vehicle body 1501, and four wheels 1502, and is configured so as to rotate the wheels 1502 by a power source (an engine) not shown provided to the vehicle body 1501. Such a vehicle 1500 incorporates the atomic oscillator 1 (or the atomic oscillator 1A). Further, a controller not shown, for example, controls the drive of the power source based on the oscillation signal from the atomic oscillator 1.

Such a vehicle is equipped with the atomic oscillator 1 or 1A (a kind of the quantum interference device) having the good frequency characteristic, and can therefore exert excellent reliability.

Although the quantum interference device, the atomic oscillator, the electronic apparatus, and the vehicle according to the disclosure are hereinabove described based on the embodiments shown in the accompanying drawings, the disclosure is not limited to these embodiments, but the configuration of each of the sections of the embodiments described above can be replaced with one having an arbitrary configuration with an equivalent function, or can also be added with an arbitrary configuration.

Further, it is sufficient for the atom cell module to include at least the atom cell, the light source, and the heater providing the atom cell module can satisfy the relational expression 1 described above, and it is possible to replace each of the constituents with a known constituent.

What is claimed is:

1. A quantum interference device comprising:
   an atom cell module including an atom cell in which alkali metal is encapsulated, a light source that emits light adapted to excite the alkali metal, and a heater that heats the atom cell and the light source;
   a package that houses the atom cell module; and
   a controller adapted to control drive of the heater so that the light source becomes at a set temperature,
   wherein the following is satisfied:

$$R<(Tv-Tout)/Qv$$

where R [° C./W] is a thermal resistance between the atom cell module and the package, Tv [° C.] is the set temperature, Tout [° C.] is an upper limit value of a usage environmental temperature set to a value lower than the set temperature, Qv [W] is an amount of heat generation of the light source.

2. The quantum interference device according to claim 1, the atom cell module further comprising:
   a support disposed between the atom cell and the package, and
   a first interconnection substrate having flexibility and including a first interconnection that electrically connects the light source and the package to each other, and wherein
   a thermal resistance of the support is lower than a thermal resistance of the first interconnection substrate.

3. The quantum interference device according to claim 1, wherein
   R1/R2 is equal to or more than 0.5 and equal to or less than 2.0,
Where R1 [° C./W] is a thermal resistance due to solid heat conduction between the atom cell module and the package, and R2 [° C./W] is a thermal resistance due to radiation between the atom cell module and the package.

4. The quantum interference device according to claim 3, wherein
the R1 is smaller than the R2.

5. The quantum interference device according to claim 3, wherein
the R1 is larger than the R2.

6. The quantum interference device according to claim 2, the atom cell module further comprising:
a photodetector that detect the light, and
a second interconnection substrate having flexibility and including a second interconnection that electrically connects the photodetector and the package to each other, and wherein
a thermal resistance of the first interconnection is lower than a thermal resistance of the second interconnection.

7. The quantum interference device according to claim 1, wherein
the R is not smaller than 3000 [° C./W].

8. The quantum interference device according to claim 1, wherein
a pressure in the package is not higher than 1 Pa.

9. An electronic apparatus comprising:
the quantum interference device according to claim 1.

10. A vehicle comprising:
the quantum interference device according to claim 1.

* * * * *